(12) United States Patent
Hoekstra

(10) Patent No.: US 10,405,102 B2
(45) Date of Patent: Sep. 3, 2019

(54) MEMS TRANSDUCER PACKAGE

(71) Applicant: Cirrus Logic International Semiconductor Ltd., Edinburgh (GB)

(72) Inventor: Tsjerk Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 12 days.

(21) Appl. No.: 15/538,611

(22) PCT Filed: Dec. 4, 2015

(86) PCT No.: PCT/GB2015/053728
§ 371 (c)(1),
(2) Date: Jun. 21, 2017

(87) PCT Pub. No.: WO2016/102924
PCT Pub. Date: Jun. 30, 2016

(65) Prior Publication Data
US 2017/0374474 A1      Dec. 28, 2017

Related U.S. Application Data

(60) Provisional application No. 62/096,363, filed on Dec. 23, 2014.

(51) Int. Cl.
*H04R 19/00*     (2006.01)
*H04R 31/00*     (2006.01)
(Continued)

(52) U.S. Cl.
CPC .......... *H04R 19/005* (2013.01); *H04R 31/00* (2013.01); *H01L 2224/48137* (2013.01);
(Continued)

(58) Field of Classification Search
CPC ...... H04R 19/005; H04R 19/04; H04R 31/00; H04R 31/003; H04R 1/342; H04R 1/2853;
(Continued)

(56) References Cited

U.S. PATENT DOCUMENTS

| 7,491,567 B2 | 2/2009 | DCamp et al. |
| 2012/0280594 A1 | 11/2012 | Chen et al. |

(Continued)

FOREIGN PATENT DOCUMENTS

| TW | 200731479 A1 | 8/2007 |
| TW | 200936491 A | 9/2009 |

(Continued)

OTHER PUBLICATIONS

International Search Report and Written Opinion of the International Searching Authority, International Application No. PCT/GB2015/053728, dated Feb. 25, 2016.

*Primary Examiner* — Lincoln D Donovan
*Assistant Examiner* — Diana J. Cheng
(74) *Attorney, Agent, or Firm* — Jackson Walker L.L.P.

(57) ABSTRACT

A MEMS transducer package is provided having a semiconductor die portion with a thickness bounded by a first surface and an opposite second surface. The package further has a transducer element incorporated in the second surface and a die back volume that extends through the thickness of the semiconductor die portion between the first surface and the transducer element. The package is completed by a cap portion that abuts the semiconductor die portion at the first surface.

16 Claims, 5 Drawing Sheets

(51) Int. Cl.
*H04R 1/34* (2006.01)
*H04R 19/04* (2006.01)

(52) U.S. Cl.
CPC ............... *H01L 2224/48227* (2013.01); *H01L 2924/10155* (2013.01); *H01L 2924/10158* (2013.01); *H01L 2924/16151* (2013.01); *H01L 2924/16152* (2013.01); *H01L 2924/16195* (2013.01); *H04R 1/342* (2013.01); *H04R 19/04* (2013.01)

(58) Field of Classification Search
CPC ... H04R 1/04; H04R 1/38; H04R 1/28; H04R 1/34; H04R 2410/07; H04R 2201/003; H04R 2499/11; H04R 2499/15; H01L 2224/48137; H01L 2224/48227; H01L 2224/48091; H01L 2224/16225; H01L 2924/10155; H01L 2924/16151; H01L 2924/16152; H01L 2924/16195; H01L 2924/00014; H01L 2924/15151
See application file for complete search history.

(56) References Cited

U.S. PATENT DOCUMENTS

| | | |
|---|---|---|
| 2013/0147040 A1 | 6/2013 | Ochs et al. |
| 2013/0322662 A1 | 12/2013 | Chen et al. |
| 2014/0341402 A1 | 11/2014 | Traynor et al. |

FOREIGN PATENT DOCUMENTS

| | | |
|---|---|---|
| TW | 201336321 A1 | 9/2013 |
| WO | 2014020389 A1 | 2/2014 |

MEMS TRANSDUCER PACKAGE

TECHNICAL FIELD

The present application relates to a Micro-electromechanical-system (MEMS) transducer package, for example a MEMS microphone package (including a Capacitive-type MEMS transducer, a Piezo-type MEMS transducer, or an Optical-type microphone), and to a semiconductor die portion and cap portion for use in a MEMS transducer package.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of the MEMS devices.

Microphone devices formed using MEMS fabrication processes typically comprise one or more membranes with electrodes for read-out/drive that are deposited on or within the membranes and/or a substrate or back-plate. In the case of MEMS pressure sensors and microphones, the electrical output signal is usually obtained by measuring a signal related to the capacitance between the electrodes. However in some cases the output signal may be derived by monitoring piezo-resistive or piezo-electric elements. In the case of capacitive output transducers, the membrane is moved by electrostatic forces generated by varying a potential difference applied across the electrodes, though in some other output transducers piezo-electric elements may be manufactured using MEMS techniques and stimulated to cause motion in flexible members.

To provide protection, the MEMS transducer may be contained within a package. The package effectively encloses the MEMS transducer and can provide environmental protection while permitting the physical input signal to access the transducer and providing external connections for the electrical output signal.

FIG. 1a illustrates one conventional MEMS microphone package 100a. A MEMS transducer 101 is attached to a first surface of a package substrate 102. The MEMS transducer 101 may typically be formed on a semiconductor die by known MEMS fabrication techniques. The package substrate 102 may be silicon or a printed circuit board (PCB) or a ceramic laminate or any other suitable material. A cover 103 is located over the transducer 101 attached to the first surface of the package substrate 102. The cover 103 may be a metallic lid. An aperture, i.e. hole, 104 in the cover 103 provides a sound port and allows acoustic signals to enter the package. In this example, the transducer 101 is wire bonded from bond pads 105 on the transducer to bond pads 105a on the package substrate 102. Electrical pathways in or on the substrate connect between the bond pads on the internal face of the substrate and lead, i.e. solder, pads 108 on the external face of the substrate to provide an external electrical connection to the transducer.

The sound port, or acoustic port, 104 allows transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port 104 acoustically couples to a first volume on one side of the transducer membrane, which may sometimes be referred to as a front volume. The second volume, sometimes referred to as a back volume, on the other side of the one or more membranes, is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths such as bleed holes, i.e. small holes in the membrane, that are configured so as to present a relatively high acoustic impedance at the desired acoustic frequencies but which allow for low-frequency pressure equalisation between the two volumes to account for pressure differentials due to temperature changes or the like).

FIG. 1b illustrates another known MEMS transducer package 100b. Again, a transducer 101, which may be a MEMS microphone, is attached to the first surface of a package substrate 102. In this example, the package 100b also contains an integrated circuit 106, which although not illustrated may also be present in FIG. 1a. The integrated circuit 106 may be provided for operation of the transducer and may, for example, be a low-noise amplifier for amplifying the signal from a MEMS microphone. The integrated circuit 106 is electrically connected to electrodes of the transducer 101 and is also attached to the first surface of the package substrate 102. The integrated circuit 106 is electrically connected to the transducer 101 via wire-bonding. A cover 107 is located on the package substrate so as to enclose the transducer 101 and the integrated circuit 106. In this package, the cover 107 is a two-piece cover that comprises an upper part or lid portion 107a and a spacer or frame portion 107b surrounding a cavity in which the transducer 101 and the integrated circuit 106 are situated. The package substrate 102, cover and frame portion may all be formed of PCB or ceramic material which may be multi-layer laminate structures. The cover 107 has a sound port 104 in the upper part 107a which allows acoustic signals to enter the package. Each of the substrates in FIGS. 1a and 1b have external lead pads, i.e. solder pads, 108 for external connection to an end user's PCB via a solder reflow process for example.

In order to buffer the generally weak transducer output signal, an integrated circuit amplifier circuit may also be used in the packages similar to that shown in FIG. 1a and connected internally in similar fashion to that shown in FIG. 1b. In some examples, the acoustic port may be provided through the substrate 102 rather than the cover, or sometimes in both to provide a differential or directional microphone.

Various other styles of packages for MEMS microphone and other MEMS transducers are available, but may be complex multi-part assemblies and/or require physical clearance around the transducer for connections, impacting material and manufacturing cost and physical size.

The embodiments disclosed herein relate to improved MEMS transducer packages.

SUMMARY

According to a first aspect of the present invention, there is provided a MEMS transducer package comprising a semiconductor die portion having a thickness bounded by a first surface and an opposite second surface, a transducer element incorporated in the second surface, and a die back volume that extends through the thickness of the semiconductor die portion between the first surface and the transducer element. The MEMS transducer package further comprises a cap portion that abuts the semiconductor die portion at the first surface.

In one embodiment, the cap portion may comprise a thickness bounded by a first surface and an opposite second surface.

The first surface of the semiconductor die portion and the second surface of the cap portion may equal in size.

In one embodiment, the second surface of the cap portion comprises a cap back volume, the cap back volume extending from the second surface of the cap portion partially into the thickness of the cap portion. The die back volume and the cap back volume may acoustically connect.

In one embodiment, a MEMS transducer package comprises a circuitry portion with a circuit thickness allocated in the semiconductor die portion in proximity of the transducer element. The circuitry portion may comprise an integrated electronic circuitry for operating the MEMS transducer element.

In one embodiment the die back volume comprises a first sub-volume with a first cross-section in a plane transverse to the thickness of the semiconductor die portion, and a second sub-volume with a second cross-section in a plane transverse to the thickness of the semiconductor die portion, wherein the first cross-section is larger than the second cross-section, and wherein a thickness of the second sub-volume is equal or larger than the circuit thickness.

The first cross-section of the first sub-volume may extend over the transducer element and the circuit portion.

According to another aspect, the die back volume may comprises a stepped back volume. The stepped back volume may comprise at least one discontinuity along a sidewall of the die back volume, between the first surface and the second surface of the semiconductor die portion.

The stepped back volume may comprises a first sub-volume adjacent to the first surface of the semiconductor die portion and a second sub-volume adjacent to the second surface of the semiconductor die portion. A lateral dimension of the first sub-volume may be greater than the lateral dimension of the second sub-volume.

In one embodiment, the circuit thickness may be bounded by at least part of a first sub-volume of a stepped die back volume and the second surface of the semiconductor die portion.

A lateral dimension of the die back volume and a lateral dimension of the cap back volume may be the same size at a plane where they meet.

According to another aspect of the present invention, there is provided a MEMS transducer device comprising: a MEMS transducer package as described above, and comprising a substrate comprising a bottom port, wherein the MEMS transducer package is mounted on the substrate and acoustically connected to the bottom port.

According to another aspect of the present invention, there is provided a wafer level package comprising: a semiconductor substrate comprising a MEMS microphone and a circuitry portion in proximity of the transducer element; and a cap portion; wherein the circuitry portion comprises an integrated electronic circuitry for operating the MEMS transducer element.

According to another aspect of the present invention, there is provided a wafer level package comprising: a semiconductor die substrate comprising a MEMS microphone transducer element, a back volume and integrated electronic circuitry for operating the MEMS transducer element; and a cap portion attached to said substrate; wherein the back volume has a first sub-volume with a cross-section that in a lateral dimension covers the transducer element and at least partially covers the integrated electronic circuitry.

BRIEF DESCRIPTION OF DRAWINGS

For a better understanding of the present invention, and to show more clearly how it may be put into effect, reference will now be made, by way of example, to the accompanying drawings, in which.

DESCRIPTION

Figure 1A:
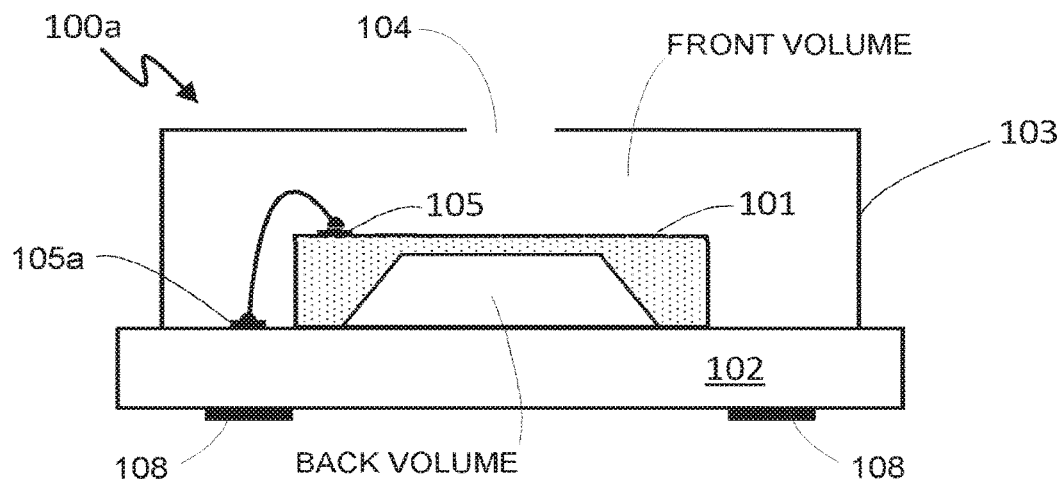
FIGS. 1a and 1b illustrate prior art MEMS transducer packages.
Figure 1B:
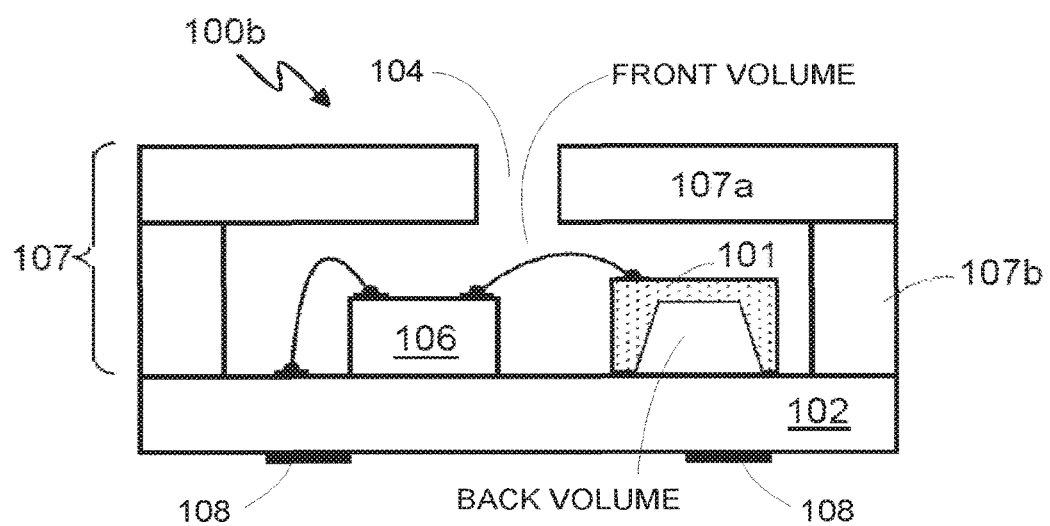

Embodiments of the present disclosure provide improved MEMS transducer packages wherein a die portion comprising a MEMS transducer, and in some embodiments a cap portion, comprise one or more acoustic channels and thus enable a MEMS transducer to be packaged more efficiently. In some embodiments, the die portion may comprise co-integrated electronic circuitry for operation of the MEMS transducer. In some embodiments, the size of a MEMS transducer package may be relatively small and/or reduced as compared to conventional packages and in some embodiments the footprint of the package may be substantially the same size as the footprint of the die portion comprising the MEMS transducer rather than being increased by some surrounding structure.

Throughout this description any features which are similar to features in other figures have been given the same reference numerals.

X2 ICP Bottom Port Embodiments

Figure 1C:
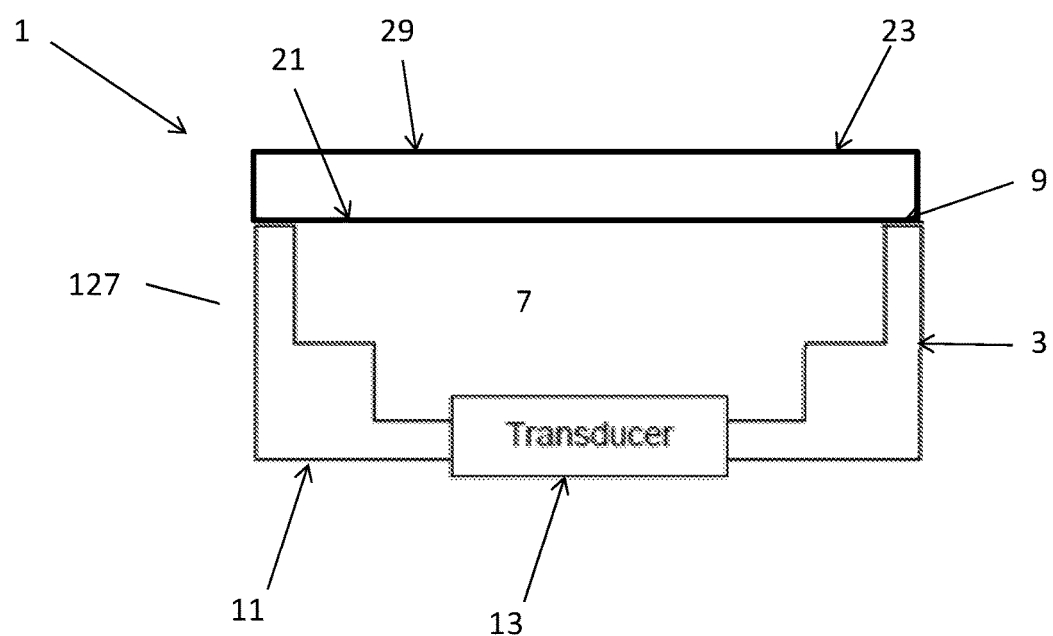
FIG. 1c illustrates a MEMS transducer package according to an embodiment of the present disclosure.

FIG. 1c shows a MEMS transducer package 1 consisting of a semiconductor die portion 3 having a thickness bounded by a first surface 9 and an opposite second surface 11 having a transducer element 13 incorporated therein. The MEMS transducer package further consists of a die back volume 7 that extends through the thickness of the semiconductor die portion 3 between the first surface 9 and the transducer element 13 and a cap portion 23 that abuts the semiconductor die portion (3) at the first surface (9). The cap portion 23 has a thickness bounded by a first surface 29 and an opposite second surface 21.

Figure 2:
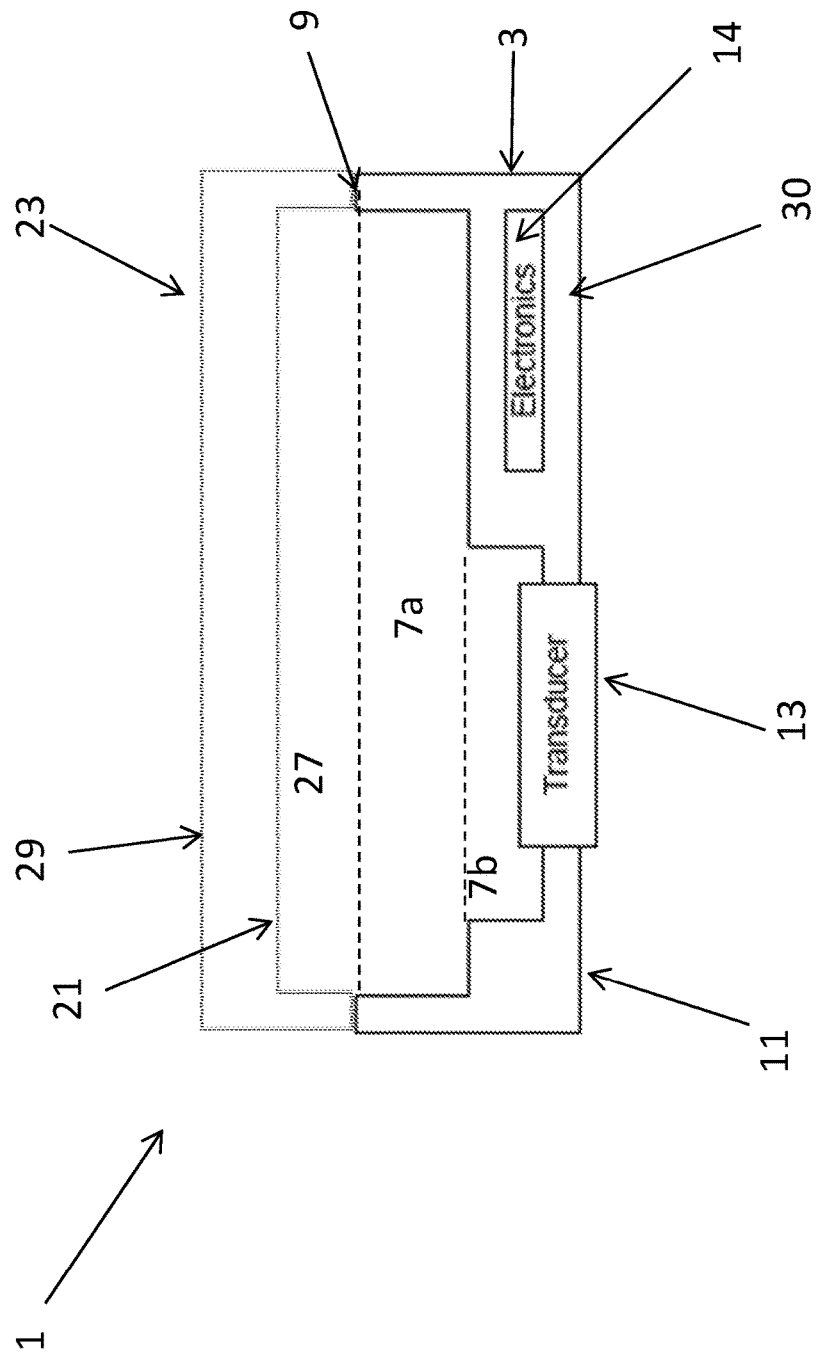
FIG. 2 illustrates a MEMS transducer package according to an embodiment of the present disclosure.

FIG. 2 shows another MEMS transducer package 1, wherein the second surface 21 of the cap portion 23 has a cap back volume 27 which extends from the second surface 21 of the cap portion 23 partially into the thickness of the cap portion 23. And the die back volume (7) and the cap back volume (27) acoustically connect.

As seen in both FIGS. 1c and 2, the first surface (9) of the semiconductor die portion and the second surface (21) of the cap portion (23) are equal in size. In addition to the transducer package of FIG. 1c, the transducer package of FIG. 2 has a circuitry portion 30 with a circuit thickness allocated in the semiconductor die portion 3 in proximity of the transducer element 13. The circuitry portion 30 comprises an integrated electronic circuitry 14 for operating the MEMS transducer element 13.

Furthermore, in FIG. 2, the die back volume 7 consists of a first sub-volume 7a with a first cross-section in a plane transverse to the thickness of the semiconductor die portion 3 and a second sub-volume 7b with a second cross-section in a plane transverse to the thickness of the semiconductor die portion 3. The first cross-section is larger than the second cross-section and the thickness of the second sub-volume 7b is equal or larger than the circuit thickness. The first cross-section of the first sub-volume 7a extends over the transducer element 13 and the circuit portion 30.

The second surface 11 of the semiconductor die portion may comprise lead, i.e. solder, pads 32a for electrical connection to electrical conductors on the substrate 30 via solder 32b for example. Respective solder pads 32a may be connected via electrical pathways, such as vias and conductive traces (not illustrated), so as to provide power (V+ and ground potentials) to the transducer and to output a signal from the transducer for example: other solder pads and operative connections may be required as needed and as would be understood by those skilled in the art. Advantageously, the solder pads 32a may be formed from the metal layers associated with the formation of the MEMS backplate and membrane metal electrodes or some other MEMS metal processing layer as opposed to the metal layers associated with the processing of the integrated electronic circuitry. Therefore, the solder pads 32b and associated metal, i.e. conductive, traces to/from the transducer, including any electronic circuitry if present, may be considered a re-distribution layer. Therefore a MEMS package as herein described with a metal layer for solder pads 32a formed during the MEMS transducer metal formation is advantageous in re-distributing the solder pads to various areas of the MEMS transducer which may be over the area where the circuitry is formed, if present.

Figure 3:
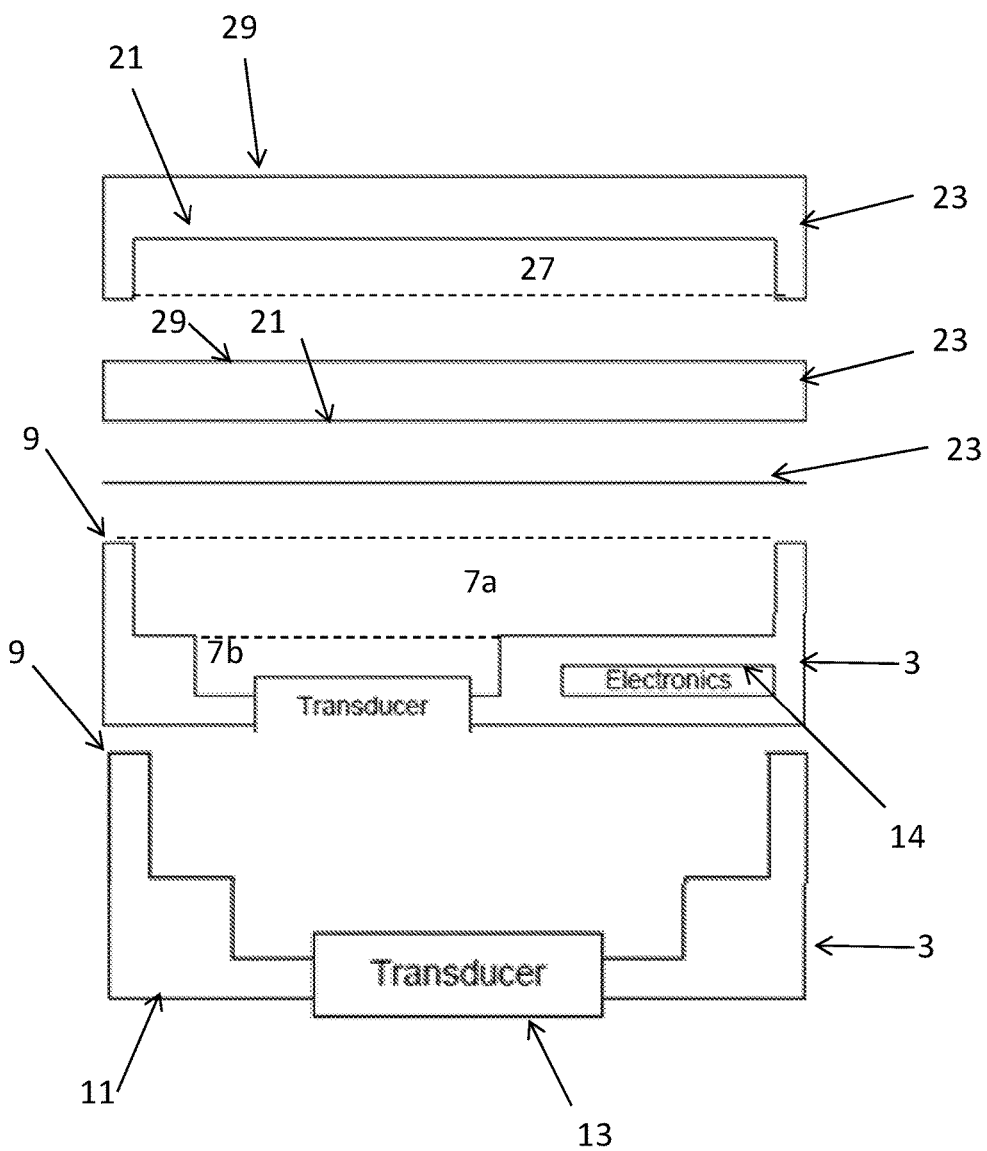
FIG. 3 illustrates a MEMS transducer package according to an embodiment of the present disclosure.

In FIG. 3, two different embodiments of semiconductor die portions 3 are shown, similar to those of FIGS. 1c and 2. It further shows three different embodiments of cap portions 23 that can be joined with each of the semiconductor portions 3 respectively.

It is also noted that in the examples described herein, the cap portion 23 may comprise, for example, a semiconductor or silicon cap portion, or a non-silicon laminated wafer, or a molded cap wafer, or a plastic cap portion, or a film or tape layer, or any other form of material. A cap portion made from semiconductor or silicon has an advantage of allowing the cap portion to be formed using wafer-level processing techniques similar to those used for manufacturing the semiconductor die portion, which means that the entire MEMS transducer package can be manufactured and assembled at the same processing site, with the cost advantages of wafer-level batch processing and other advantages such as matching the coefficients of thermal expansion to avoid thermally induced stresses.

Stepped Back Volumes

Referring to FIGS. 1c and 2, according to one embodiment, a die back volume 7 comprises a stepped back volume 7a/7b. For example, the stepped back volume may comprise at least one discontinuity along a sidewall of the stepped back volume, between the first surface 9 and the second surface 11 of the semiconductor die portion 3.

In one example, the stepped back volume comprises a first sub-volume 7a adjacent to the first surface 9 of the semiconductor die portion 3 and a second sub-volume 7b adjacent to the transducer 13. The first and second sub-volumes 7a, 7b may abut as shown (that is to form a single back volume). A lateral dimension of the first sub-volume 7a may be greater than a corresponding lateral dimension of the second sub-volume 7b. The lateral dimension of the second sub-volume may correspond to that of the transducer 13, whereas the lateral dimension of the first sub-volume is not so constrained.

In one example, a cross-sectional area of the die back volume 7 and a cross-sectional area of the cap back volume 27 are substantially the same at a plane where they meet. In other examples, a cross-sectional area of the die back volume 7 is smaller than the cross-sectional area of the cap back volume 27 at a plane where they meet. In other examples a cross-sectional area of the die back volume 7 is greater than the cross-sectional area of the cap back volume 27 at a plane where they meet.

Although the embodiment of FIG. 2 shows the stepped sidewall extending in one lateral direction, it is noted that the stepped sidewall may also extend in another lateral direction.

Furthermore, although the respective sub-volumes are shown as comprising sidewalls that are substantially orthogonal to the first surface 9 of the semiconductor die portion 3, it is noted that the sidewalls of any sub-volume portion may be sloped with respect to the first surface 9 of the semiconductor die portion 3.

The use of a stepped back volume thus has an advantage of enabling the overall volume of the back volume to be increased for a given thickness between the first surface 9 and second surface 11 for a given size of transducer. It is noted that one or more further stepped portions may be provided.

It is noted that a cap portion 23, when comprising a cap back volume 27, may also comprise a stepped cap back volume 27. The stepped cap back volume 27 of the cap portion 23 may comprise any of the characteristics noted above relating to the sub-volumes 7a and 7b of the stepped die back volume 7. In an embodiment having a molded cap portion, this may provide a greater design freedom compared to a silicon cap portion.

It is noted that a stepped die back volume and stepped cap back volume may be used in any of the embodiments described herein that comprise a back volume.

Figure 4:
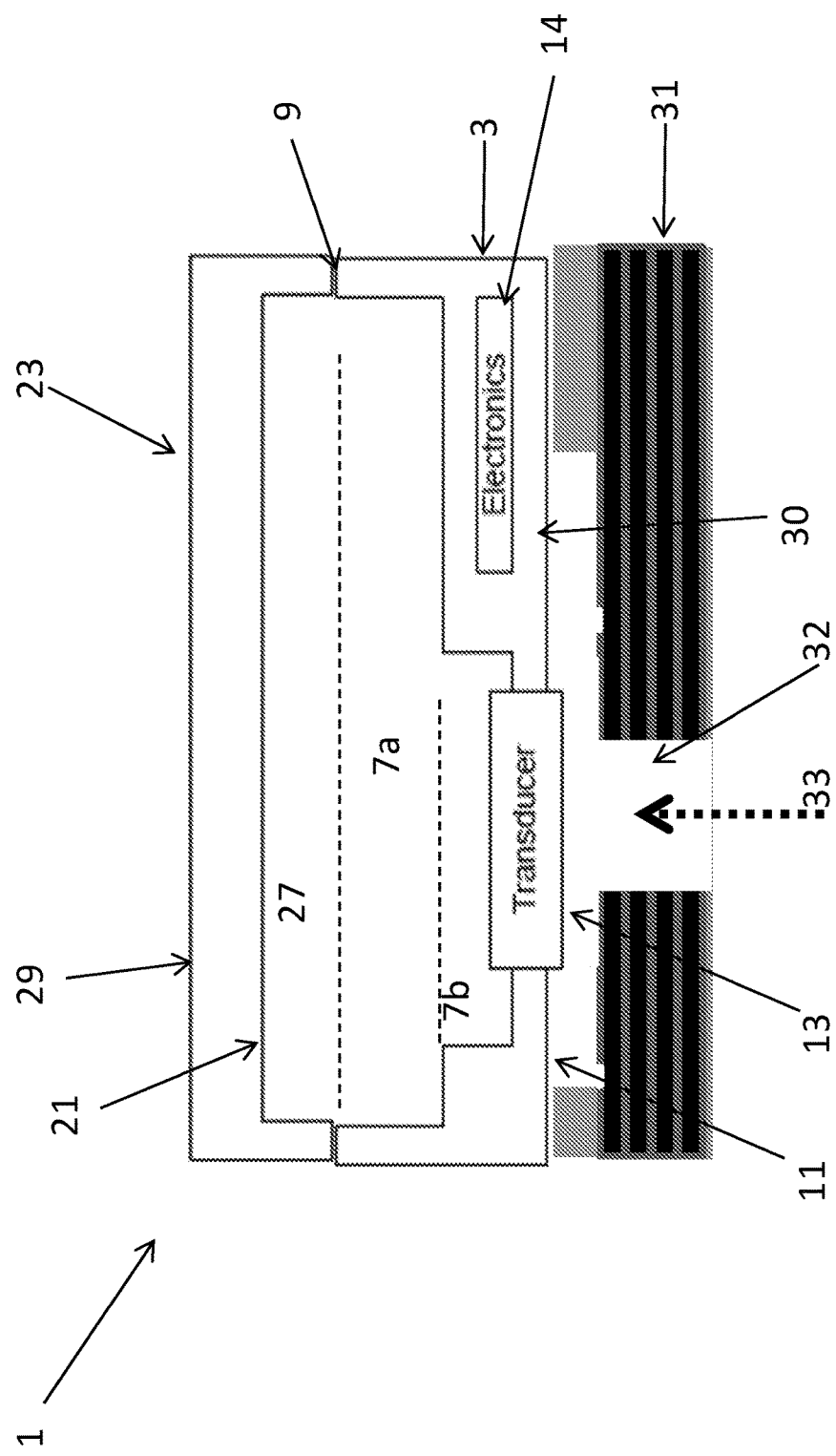
FIG. 4 illustrates a MEMS transducer package according to an embodiment of the present disclosure.

FIG. 4 shows a MEMS transducer device comprising a MEMS transducer package 1 as described above and a substrate 31 provided with a bottom port 32. In this embodiment, the MEMS transducer package 1 is mounted on the substrate 31 and acoustically connected to the bottom port 32. The bottom port 32 provides a sound path 33 allowing sound to travel to and impinge on the transducer element 13.

MEMS transducer packages are fabricated by thousands at a time on a single die wafer. Such a wafer can be directly capped by a cap portion. Thereby obtaining a wafer level package comprising a semiconductor substrate 3 comprising a MEMS microphone and a circuitry portion in proximity of the transducer element 13 and a cap portion 23 attached to said substrate. The circuitry portion comprises the integrated electronic circuitry 14 for operating the MEMS transducer element 13.

In another embodiment, the semiconductor die substrate 3 may comprise a MEMS microphone transducer element 13, a back volume 7, integrated electronic circuitry 14 for operating the MEMS transducer element 13, and a cap portion (23) attached to said substrate (3). In this embodiment, the back volume 7 has a first sub-volume 7a with a cross-section that in a lateral dimension covers the transducer element 13 and at least partially covers the integrated electronic circuitry 14.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezoelectric elements. The embodiments are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is also noted that one or more further portions may be added to an embodiment described above, i.e. in addition to the die portion 3 and cap portion 23. Such a portion, if present, may comprise an acoustic channel which cooperates with an acoustic channel(s) in the die portion and/or cap portion, to provide a desired sound port. For example, in an example where a die portion is provided to incorporate a transducer element, an integrated circuit portion to incorporate an integrated circuit, and a cap portion to form a cap, one or more of these portions may comprise acoustic channel(s) to provide a sound port as described herein.

It should be noted that the above-mentioned embodiments illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, "or" does not exclude "and", and a single processor or other unit may fulfil the functions of several units recited in the claims. Any reference signs in the claims shall not be construed so as to limit their scope.

The invention claimed is:
1. A wafer level MEMS transducer package device comprising:
a semiconductor die portion having a thickness bounded by a first surface and an opposite second surface, the second surface corresponding to an underside of the semiconductor die portion;
a transducer element formed on the underside of the semiconductor die portion in the second surface;
a die back volume that extends through the thickness of the semiconductor die portion between the first surface and the transducer element; and
a cap portion that abuts the semiconductor die portion at the first surface.

2. The wafer level MEMS transducer package device as claimed in claim 1, the cap portion comprising a thickness bounded by a first surface and an opposite second surface.

3. The wafer level MEMS transducer package device as claimed in claim 2, wherein the first surface of the semiconductor die portion and the second surface of the cap portion are equal in size.

4. The wafer level MEMS transducer package device as claimed in claim 2, wherein the second surface of the cap portion comprises a cap back volume, the cap back volume extending from the second surface of the cap portion partially into the thickness of the cap portion.

5. The wafer level MEMS transducer package device as claimed in claim 4, wherein the die back volume and the cap back volume acoustically connect.

6. The wafer level MEMS transducer package device as claimed in claim 1, comprising a circuitry portion with a circuit thickness allocated in the semiconductor die portion in proximity of the transducer element.

7. The wafer level MEMS transducer package device as claimed in claim 6, wherein the circuitry portion comprises an integrated electronic circuitry for operating the MEMS transducer element.

8. The wafer level MEMS transducer package device as claimed in claim 6, wherein the die back volume comprises:
a first sub-volume with a first cross-section in a plane transverse to the thickness of the semiconductor die portion; and
a second sub-volume with a second cross-section in a plane transverse to the thickness of the semiconductor die portion;
wherein the first cross-section is larger than the second cross-section; and
wherein a thickness of the second sub-volume is equal or larger than the circuit thickness.

9. The wafer level MEMS transducer package device as claimed in claim 8, wherein the first cross-section of the first sub-volume extends over the transducer element and the circuit portion.

10. The wafer level MEMS transducer package device as claimed in claim 1, wherein the die back volume comprises a stepped back volume.

11. The wafer level MEMS transducer package device as claimed in claim 10, wherein the stepped back volume comprises at least one discontinuity along a sidewall of the die back volume, between the first surface and the second surface of the semiconductor die portion.

12. The wafer level MEMS transducer package device as claimed in claim 10, wherein the stepped back volume comprises a first sub-volume adjacent to the first surface of the semiconductor die portion and a second sub-volume adjacent to the second surface of the semiconductor die portion.

13. The wafer level MEMS transducer package device as claimed in claim 8, wherein a lateral dimension of the first sub-volume is greater than the lateral dimension of the second sub-volume.

14. The wafer level MEMS transducer package device as claimed in claim 9, wherein the circuit thickness is bounded by at least part of a first sub-volume of a stepped die back volume and the second surface of the semiconductor die portion.

15. The wafer level MEMS transducer package device as claimed in claim 4, wherein a lateral dimension of the die back volume and a lateral dimension of the cap back volume are the same size at a plane where they meet.

16. A MEMS transducer device, comprising:
- a wafer level MEMS transducer package device as claimed in claim 1; and
- a substrate comprising a bottom port;
- wherein the MEMS transducer package is mounted on the substrate and acoustically connected to the bottom port.

* * * * *